US007948332B2

(12) United States Patent
Trott et al.

(10) Patent No.: US 7,948,332 B2

(45) Date of Patent: May 24, 2011

(54) N-CHANNEL MULTIPLEXER

(75) Inventors: Keith D. Trott, Shrewsbury, MA (US); Robert V. Cummings, Anaortes, WA (US); Mark R. DeLuca, Methuen, MA (US); Ronni J. Cavener, Haverhill, MA (US); Joseph P. Biondi, Townsend, MA (US); George S. Lafave, Tewksbury, MA (US); Jeffrey D. Cotton, Sudbury, MA (US)

(73) Assignee: Raytheon Company, Waltham, MA (US)

( * ) Notice: Subject to any disclaimer, the term of this patent is extended or adjusted under 35 U.S.C. 154(b) by 200 days.

(21) Appl. No.: 12/241,338

(22) Filed: Sep. 30, 2008

(65) Prior Publication Data

US 2010/0079220 A1 Apr. 1, 2010

(51) Int. Cl.
*H01P 5/12* (2006.01)
*H03H 7/42* (2006.01)
*H03H 7/46* (2006.01)

(52) U.S. Cl. ........................... 333/126; 333/134; 333/26

(58) Field of Classification Search .................. 333/126, 333/129, 132, 134, 25, 26

See application file for complete search history.

(56) References Cited

U.S. PATENT DOCUMENTS 5,218,619 A 6/1993 Dent
5,353,352 A 10/1994 Dent et al.
5,550,809 A 8/1996 Bottomley et al.
5,574,411 A * 11/1996 Apel et al. ...................... 333/25
5,742,678 A 4/1998 Dent et al.
5,771,288 A 6/1998 Dent et al.
5,809,060 A 9/1998 Cafarella et al.
6,075,812 A 6/2000 Cafarella et al.
6,125,136 A 9/2000 Jones et al.
6,215,813 B1 4/2001 Jones et al.
6,233,271 B1 5/2001 Jones et al.

(Continued)

FOREIGN PATENT DOCUMENTS

CA 1 164 053 * 3/1984

OTHER PUBLICATIONS

Trott et al.; "Wideband Phased Array Radiator;" 2003 IEEE International Symposium on Phased Array Symposium and Technology; Oct. 14-17, 2003; ISBN: 0-7803-7827-X; pp. 383-386.

(Continued)

*Primary Examiner* — Barbara Summons

(74) *Attorney, Agent, or Firm* — Daly, Crowley, Mofford & Durkee, LLP

(57) ABSTRACT

A radio frequency (RF) channelizer includes a first four-port balun, a second four part balun and a pair of filters coupled between the first and second four port baluns. The filters operate such that RF signals having a frequency within a desired frequency band (so-called "in-band" signals) can propagate between the first and second baluns (e.g. from the first balun to the second balun) while signals having a frequency outside the desired frequency band (so-called "out-of-band signals") are reflected back to the first balun. One filter reflects out-of-band signals while maintaining the magnitude and phase of the signal (i.e. with a 0 degree phase shift), while the other filter reflects out-of-band signals with a phase-reversal (i.e. with a 180 degree phase shift). With this approach, the reflected signals propagate to a sum port (or even mode port) of the first balun. In this way, the balun-filter combination results in a channelizer which separates signals into different frequency bands.

20 Claims, 8 Drawing Sheets

U.S. PATENT DOCUMENTS

| | | | | |
|---|---|---|---|---|
| 6,278,340 | B1 * | 8/2001 | Liu | 333/26 |
| 6,285,273 | B1 * | 9/2001 | Morikawa | 336/200 |
| 6,351,192 | B1 * | 2/2002 | Sheen | 333/26 |
| 6,473,449 | B1 | 10/2002 | Cafarella et al. | |
| 6,526,091 | B1 | 2/2003 | Nystrom et al. | |
| 6,563,858 | B1 | 5/2003 | Fakatselis et al. | |
| 6,603,801 | B1 | 8/2003 | Andren et al. | |
| 6,674,818 | B1 | 1/2004 | King et al. | |
| 6,678,310 | B1 | 1/2004 | Andren et al. | |
| 6,680,928 | B1 | 1/2004 | Dent | |
| 6,690,715 | B2 | 2/2004 | Webster et al. | |
| 6,693,954 | B1 | 2/2004 | King et al. | |
| 6,985,699 | B2 | 1/2006 | Fiore | |
| 7,079,592 | B2 | 7/2006 | Chang et al. | |
| 7,180,457 | B2 | 2/2007 | Trott et al. | |
| 7,346,918 | B2 * | 3/2008 | Hennenhoefer et al. | 725/74 |
| 7,495,525 | B2 * | 2/2009 | Ilkov et al. | 333/26 |
| 7,557,673 | B1 * | 7/2009 | Meharry | 333/25 |
| 2006/0038732 | A1 | 2/2006 | DeLuca et al. | |

OTHER PUBLICATIONS

Trott et al.; "7-21 GHz Wideband Phased Array Radiator;" 2004 IEEE Antennas and Propagation Society International Symposium; Jun. 20-25, 2004; ISBN: 0-7803-8302-8; vol. 3; pp. 2265-2268.

* cited by examiner

N-CHANNEL MULTIPLEXER

TECHNICAL FIELD

The invention relates to radio frequency (RF) mutliplexers and, in particular, to RF N-channel multiplexers which utilize 4-port baluns.

BACKGROUND

There has been a trend to provide radio frequency (RF) systems which are compatible with radar, communications and/or electronic warfare (EW) systems. RF systems which are compatible with radar, communications and/or EW systems are sometimes referred to as multifunction systems. Each of the radar, communications and EW systems typically operate in different RF frequency bands. Thus, multifunction systems often include a wide band antenna (typically an array antenna) which is responsive to RF signals over a wide range of RF frequencies such that RF signals in the radar, communications and EW frequency ranges can be received by the antenna.

Multifunction systems may also include multiple RF receivers, with different ones of the receivers tuned to receive signals in one of the radar, communications or EW frequency bands. Each of the RF receivers thus has a bandwidth which is less than the overall bandwidth of the wide band antenna. It is thus necessary to separate or "channelize" the broadband RF signals received by the antenna into portions appropriate for reception by respective ones of the narrow band receivers. Once the RF signals are separated (or channelized) into desired RF bands, the output signals of those bands can be provided to the appropriate ones of the narrow band receivers.

Typically, a multi-stage channelizer, (also referred to herein as an "N-channel multiplexer" or more simply, an "N-plexer"), is used to separate RF signals. A multi-stage channelizer splits an input signal having a frequency bandwidth into N signals each having a subset of the frequency bandwidth. For example, a one-stage channelizer (also referred to herein as a two-channel multiplexer) may split an input signal operating over a 10 to 20 GHz bandwidth into a first signal having a first bandwidth (e.g. a 10 to 12 GHz bandwidth) and a second signal having a second bandwidth (e.g. a 12 to 20 GHz bandwidth).

One technique to channelize broadband signals is to use a channelizer which includes an active tunable filter. This technique requires DC power to be provided to the channelizer for the active tunable filter and also requires a relatively complex filter. Passive techniques include the use of Wilkinson power dividers. Passive techniques are relatively simple to implement, however, such techniques also add 3 dB of insertion loss for each desired channel. N-stage channelizers may also be constructed from baluns. However, prior attempts to construct N-stage channelizers using baluns have focused on double-y baluns or three-port baluns.

SUMMARY

A single stage of an N-stage radio frequency (RF) channelizer (wherein N is greater than or equal to 1) includes a first four-port balun, a second four part balun and a pair of filters coupled between the first and second four port baluns. The filters operate such that both filters allow signals having a frequency within a desired frequency band (so-called "in-band" signals) to propagate between the first and second baluns (e.g. from the first balun to the second balun) while also reflecting signals outside the desired frequency band (so-called "out-of-band signals") back to the first balun. One filter reflects the signal in the filter stop band (i.e. the out-of-band signal) while maintaining the magnitude and phase of the signal, while the other filter reflects a phase-reversed signal in the filter stop band. This provides a signal that propagates to a sum port (or even mode port) of the first balun. In this way, the balun-filter combination results in a channelizer which separates signals into different frequency bands. Such channelizer stages may be cascaded to provide a multi-stage channelizer having multiple output channels.

DETAILED DESCRIPTION

Before providing a detailed description of a radio frequency (RF) channelizer (also referred to as an N-channel multiplexer or N-plexer) provided from a pair of four-port baluns and a pair of filters (with the combination of appropriately coupled balun and filter pairs referred to hereinbelow as a "stage"), some introductory concepts are explained. A four-port balun provides port access to (or termination of) a fourth port (typically the even mode) and also makes the balun structure symmetric. By utilizing a fourth port of the balun, the circuit functions in a manner similar to that of a broadband "rat-race" hybrid. The sum port passes even-mode signals through the balun, while the difference port passes odd-mode signals. Passing a signal through the sum or difference port and terminating the two output ports in short and open circuit impedances cause the signal to change mode and reflect through the opposite input port. In one embodiment, filter networks (which may include, for example, Pi and T filters) can be designed to have exact pass band phase and amplitude characteristics. Stop band reflections from one filter (e.g. the T-filter) will be 180 degrees out of phase (compared to its input). Stop band reflections from the other filter (e.g. the Pi filter) are in phase (compared to its input). Thus, the filters look like an open and short circuit terminations (respectively). The phase reversal of the out-of-band reflections for the T-filter is what makes the signal change mode from odd to even and is therefore sent back to the sum port of the previous balun. The signal may then be provided to an output port or, optionally, may be passed to a next stage of the N-plexer.

Figure 1:
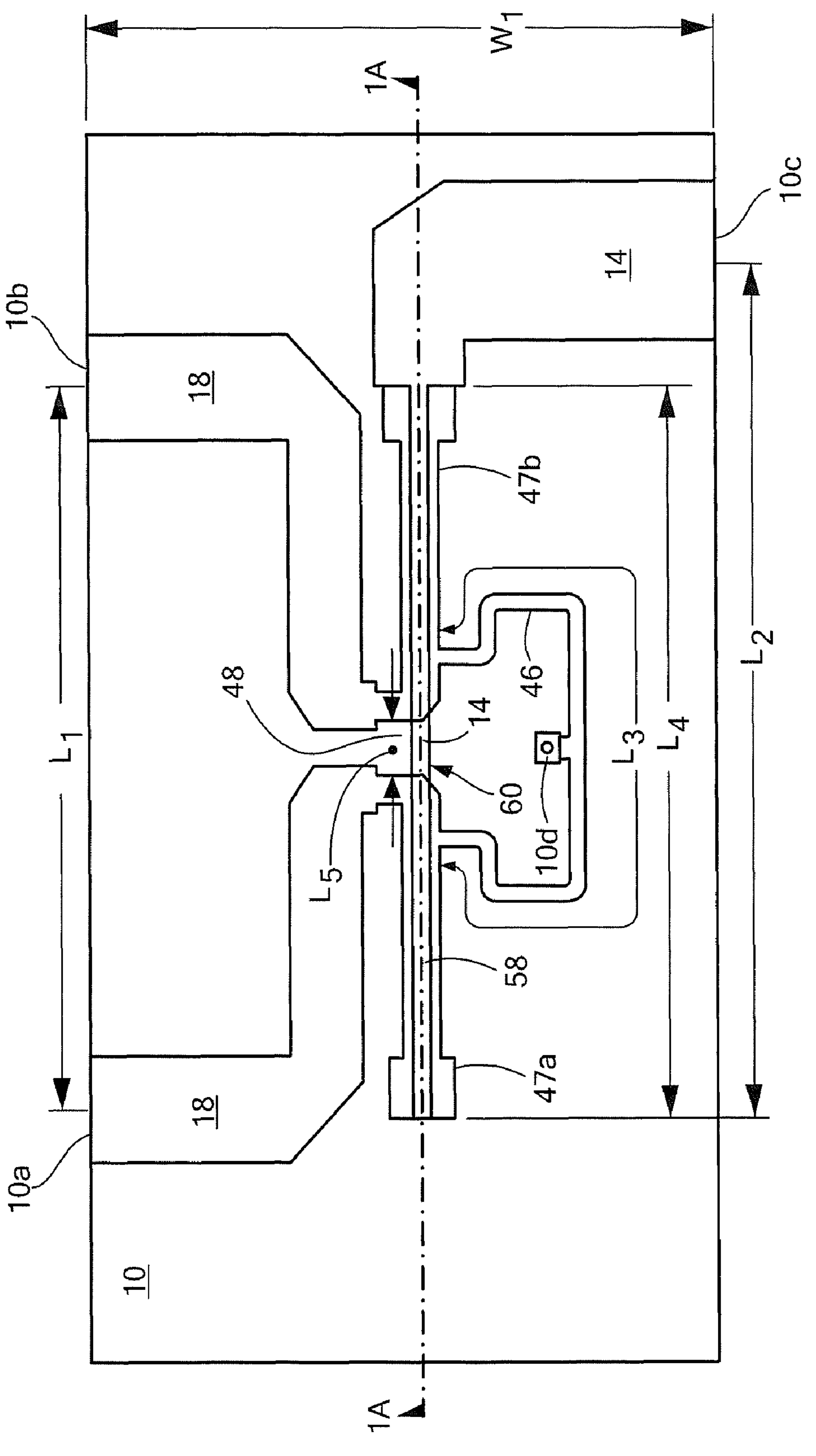
FIG. 1 is a plan view of a four-port balun.
Figure 1A:
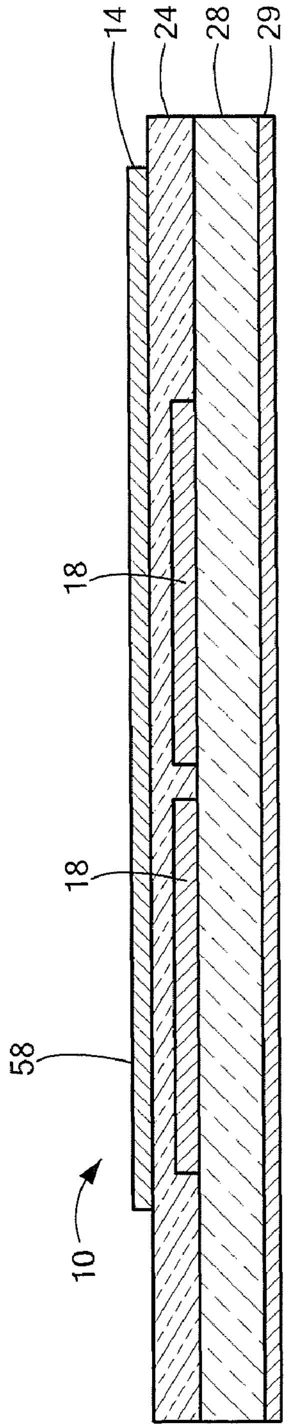
FIG. 1A is a cross-sectional diagram of a balun taken across lines 1A-1A in FIG. 1.

Referring to FIGS. 1 and 1A in which like elements are provided having like reference numerals throughout the several views, a balun 10 having four ports 10*a*, 10*b*, 10*c*, 10*d* includes first and second signal paths 14, 18. As will become apparent from the description herein below, depending upon the function provided by the balun 10 in an N-stage channelizer circuit (where N is equal to or greater than 1), any of the ports 10_a_-10_d_ can serve as input or output ports.

In the particular embodiment shown in FIGS. 1 and 1A, signal path 14 is implemented as a microstrip transmission line disposed on a first surface (or layer) of a dielectric substrate 24. Signal path 18 is provided as a conductor disposed over a first surface of a second substrate 28. The first substrate 24 is disposed over the second substrate 28 and the signal paths 14, 18 are aligned such that in regions where signal path 14 overlaps signal path 18, signal path 18 serves as a ground plane for signal path 14 hence forming the microstrip transmission line configuration.

The substrate 28 is provided having a ground plane 29 disposed on a second surface thereof. In one particular embodiment, substrate 18 is provided from a polyimide material having a thickness of about 0.001 inch and substrate 28 is provided from alumina having a thickness of about 0.010 inch. In one exemplary embodiment, the widths of signal paths 14, 18 are selected to provide a 50 Ω characteristic impedance at the input/output ports of the balun 10. The signal path 18 has a length $L_1$ and the signal path 14 has a length $L_2$. The balun 10 has a width $W_1$. In one embodiment, for operation in the 7-21 gigahertz (GHz) frequency range, the length $L_1$ is about 1 inch and the width $W_1$ is about 0.5 inch.

A first end of signal path 18 terminates at port 10_a_ and a second end of signal path 18 terminates at port 10_b_. Signal path 18 includes a loop section 46 having a length, $L_3$. Signal path 18 also includes sections 47_a_, 47_b_, which as mentioned above, act as ground planes to form a microstrip configuration in conjunction with signal paths 14. As shown in FIG. 1, the ends of sections 47_a_, 47_b_ may have "pads" (i.e. rectangular shaped portions) formed thereon and in some embodiments, the pads of sections 47_a_, 47_b_ are coupled to a short circuit impedance (e.g. by soldering or otherwise electrically connecting the pad to ground plane 29 (FIG. 1A). Conductors 18 are spaced apart in a gap region 48 by a distance $L_5$.

The width of $L_5$ is selected as part of the design process to improve or in some cases even optimize the impedance match between the balun or channelizer and the characteristic impedance of the system. The length of $L_3$ is chosen such that it corresponds to one-half wavelength at mid-frequency of the design band. In one exemplary embodiment, this can be accomplished by having the two opposing legs be one-quarter wavelength each for a total of one-half wavelength. This distance is embodied in loop 46 which is used to make the circuit functionally equivalent to a rat-race circuit and the phase shift provides signal cancellation/termination at sum port 10_d_. Even though the loop section 46 is provided having a substantially rectangular shape as shown in FIG. 1, loop section 46 may be provided having any shape including but limited to, for example, a round shape, an oval shape, a rectangular shape or any regular or irregular geometric shape. The considerations in selecting a shape of the loop section 46 include, but are not limited to desired line separation (which depends upon the width of the transmission line shown in loop and available space).

With loop 46 having a length of approximately one-quarter wavelength for each leg, for a total loop 46 distance of one-half wavelength, port 10_c_ corresponds to a so-called difference (Δ) port of balun 10 and port 10_d_ corresponds to a so-called sum (Σ) port of balun 10. Signal path 14 also includes a section 58 having a length, $L_4$. In a preferred embodiment, length $L_4$ corresponds to one-half wavelength at a center frequency of the design band. The intersection of the section 58 and the gap 48 forms a virtual junction 60.

By appropriately selecting the transmission line lengths $L_1$ through $L_4$ of the balun 10, the balun effectively functions as a broadband "rat-race" hybrid. The sum port 10_d_ passes even-mode RF signals through the circuit, while the difference port 10_c_ passes odd-mode RF signals. In one embodiment, the line lengths (e.g., $L_1$ through $L_5$) and the line widths are selected such that the balun 10 operates over a 7 to 21 GHz frequency bandwidth.

Figure 2:
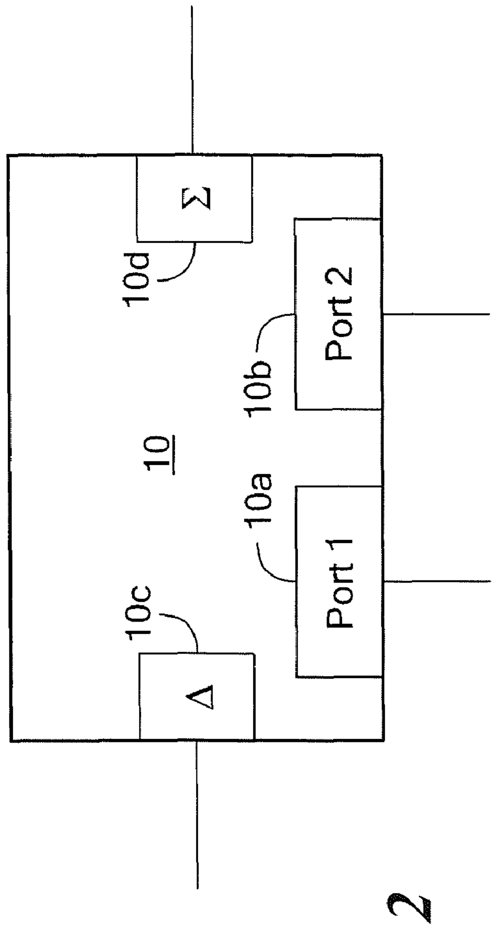
FIG. 2 is a block diagram of a four-port balun which may be of the type shown in FIG. 1A for example.

Referring now to FIG. 2, in operation, when an RF signal is applied to the difference port 10_c_, the signal is split at the virtual junction 60 so that odd-mode signals propagate along signal path 18 and appear at ports 10_a_, 10_b_ having equal power and being 180 degrees out of phase. Even-mode signals on the other hand, having equal power and being in-phase, propagate to the sum port 10_d_.

When an RF signal is fed through the sum port 10_d_ and ports 10_a_ and 10_b_ are terminated with open and short circuit impedances, respectively, the signal reflects through the balun and appears at the difference port 10_c_. Similarly, passing a signal through the difference port 10_c_ and terminating the two ports 10_a_ and 10_b_ with open and short circuit impedances cause the signal to reflect through the balun and appear at the sum port 10_d_.

The balun 10 may also be operated in reverse. For example, a pair of balanced signals (i.e. equal power signals), 180 degrees out of phase with each other, may be applied to the ports 10_a_, 10_b_, respectively, to provide an output signal at the difference port 10_c_.

In one embodiment, the balun 10 has an insertion loss characteristic of less than 0.7 dB across the band (e.g. a cross a bandwidth of 7-21 GHz). Also, the amplitude match is better than 0.5 dB and the phase balance is about 3 degrees across the entire band.

As will be shown and described below in conjunction with FIGS. 3-6, multiple stages (i.e. balun pairs coupled with filter pairs) can be combined to form multi-stage channelizers (also known as "N-channel multiplexers" or more simply, "N-plexers"). It should be appreciated that all baluns included in the channelizer could operate over the original input frequency range, or alternately, the first balun could be selected to operate over the entire input frequency range and subsequent baluns (i.e. baluns after the first balun) could be designed to operate over smaller frequency ranges (e.g. portions of the input frequency range) to take advantage of the reduced bandwidth of a channelized stage. The filters should be provided having the out-of-band filter response characteristics of Pi and T filters (i.e. out-of-band reflection of 0 degrees and 180 degrees), but may otherwise be provided as low pass filters, band stop filters, band pass filters, high pass filters or any other filter type. Those of ordinary skill in the art will know how to select a particular type of filter to use in a stage.

Figure 3:
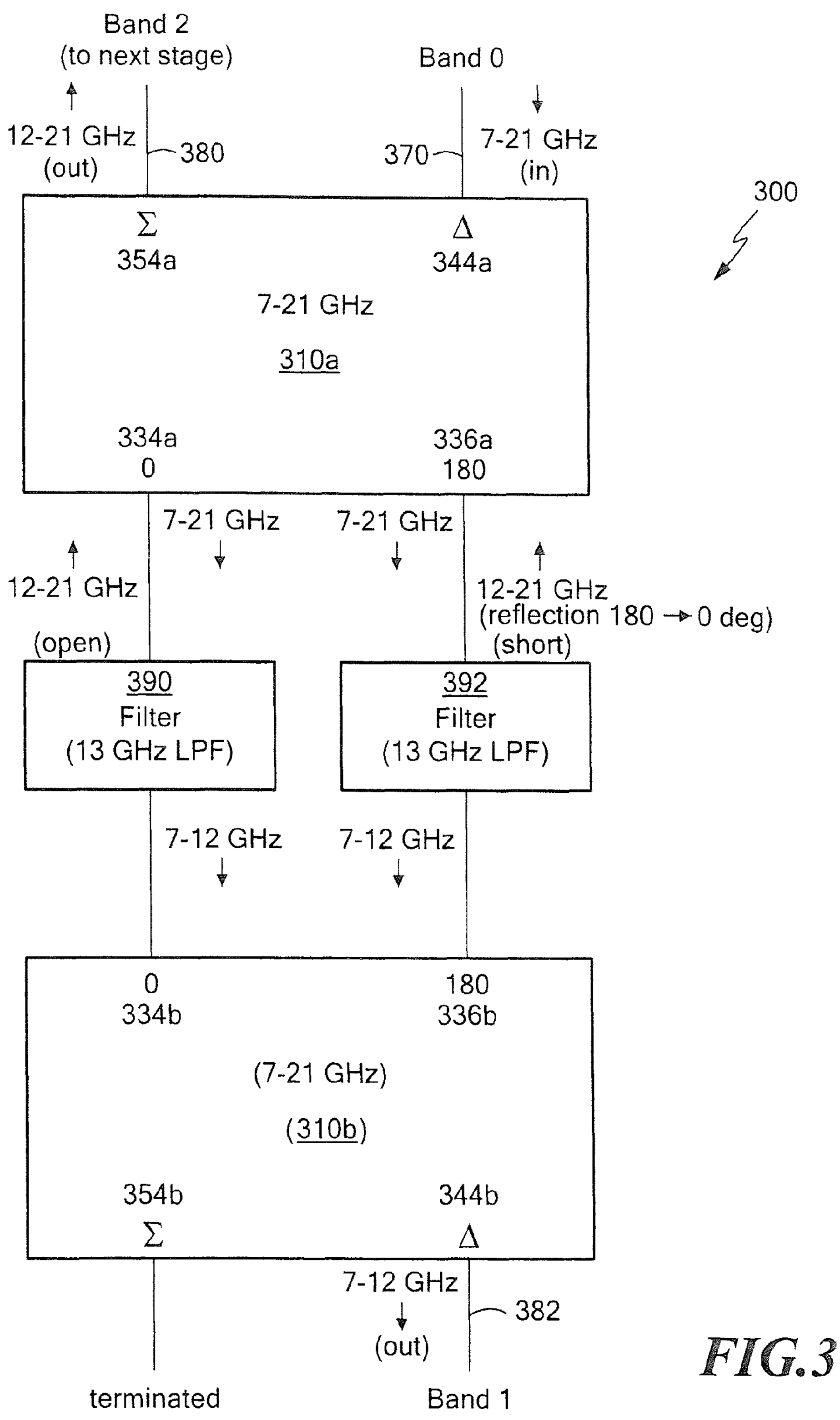
FIG. 3 is a block diagram of a one-stage channelizer (also sometimes referred to as a two-channel multiplexer).

Referring now to FIG. 3, a one-stage channelizer 300 (also referred to as a two-channel multiplexer) includes a single channelizer stage comprised of a first balun 310_a_, a second balun 310_b_ and filters 390, 392 coupled between the baluns 310_a_, 310_b_. In one embodiment, the filters 390, 392 are provided as low pass Pi and T filters 390, 392.

Baluns 310_a_ and 310_b_ may be substantially the same as balun 10 described above in conjunction with FIGS. 1-2. For example, the balun 310_a_ includes a difference port 344_a_, a sum port 354_a_, a first port 334_a_ and a second port 336_a_. The balun 310_b_includes a difference port 344_b_, a sum port 354_b_, a first port 334_b_ and a second port 336_b_. In this particular configuration, sum port 354_b_ not used and thus can be terminated with a matched impedance. The Pi filter 390 is coupled between the first port 334_a_ of balun 310_a_ and the first port 334*b* of balun 310b. The T filter 392 is coupled between the second port 336*a* of balun 310*a* and the second port 336*b* of balun 310*b*.

The operation of the channelizer is as described below. It should be appreciated that in the below description, the filters 390, 392 are provided as low pass Pi and T filters, 390, 392. To signals having a frequency outside a frequency band of interest (so-called out-of-band signals), the Pi filter presents an open circuit impedance characteristic and the T filter presents a short circuit impedance characteristics. Thus, out-of-band signals reflected from the T filter undergo a phase reversal (i.e. the reflected signals undergo a 180 degree phase shift) while out-of-band signals reflected from the Pi filter do not undergo a phase reversal (i.e. the reflected signals undergo a 0 degree phase shift). Conventional filter designs and fabrication techniques can be used to provide the filters. In one exemplary embodiment, the filters are provided using a Butterworth design, but other filter designs may, of course, also be used.

The one-stage channelizer 300 includes an input line 370 coupled to the difference port 344*a* of the balun 310*a*. RF signals having a frequency within the full band of frequencies accepted by channelizer 300 (identified as Band 0 in FIG. 3) are provided to the channelizer 300 via signal path 370. In one embodiment, the full frequency band (i.e. Band 0) is 7-21 GHz. Other frequency ranges may, of course, also be used. A first output line 380 coupled to the sum port 354*a* of the balun 310*a* represents one channel and a second output line 382 coupled to the difference port 344*b* of the balun 310*b* corresponds to another channel.

The Pi filter and the T filter are preferably provided having pass bands with relatively low insertion loss characteristics and are provided having substantially matched pass band phase and amplitude characteristics. In the stop band, the filters reflect substantially the entire signal. As mentioned above, the signals reflected from the respective filters will be in phase for the Pi filter 390 and 180 degrees out of phase for the T filter 392. Thus, the filters appear as open circuit and short circuit terminations to signals having frequencies outside of the pass band of the respective filters. Thus, with the above-described filter characteristics, the operation of the channelizer is as described below.

A signal having a first bandwidth (Band 0) is received at the input line 370. The signal propagates through balun 310*a* to ports 334*a*, 336*a*. Portions of the Band 0 signal which are within the passbands of filters 390, 392 propagates through the passbands of filters 390, 392 and the remainder of the Band 0 signal (i.e. portions of the Band 0 signal outside of the filter passbands) toward balun ports 334*a*, 336*a*.

In the case where the filters 390, 392 are provided as low pass filters, the low frequency portions of the Band 0 signal appear at output port 382 (and designated Band 1 in FIG. 3) while higher frequency portions of the Band 0 appear at output port 380 (and designated as Band 2 in FIG. 3). It should be appreciated that in most practical applications, Band 0=Band 1+Band 2. For example, if Band 0=7-21 GHz and Band 0 is channelized into two bands (i.e. Band 1 and Band 2), then Band 1 may be 7-12 GHz and Band 2 may be 12-21 GHz.

Thus, a signal having a first bandwidth (Band 0) is provided to input line 370 and with filters 390, 392 provided as low pass filters, the channelizer 300 provides a first or lower frequency channel output having a bandwidth designated as Band 1 and a second or higher frequency channel output having a bandwidth designated as Band 2.

In an example of a specific operation of the one-stage channelizer 300, in response to a signal received by balun 310*a* at difference port 344*a*, two balanced (i.e. equal amplitude or equal power) output signals 180 degrees out of phase are provided at the first and second ports 334*a*, 336*a*, respectively. A first output signal is coupled from the port 334*a* to the filter 390 which is provided as a Pi filter and a second output signal is coupled from the second port 336*a* to the filter 392 which is provided as a T filter. The first output signal and the second output signal are balanced and 180 degrees out of phase with respect to each other.

The Pi filter 390 and the T filter 392 are provided having low pass filter characteristics. Both filters allow the in-band signals to pass with their magnitude and phase intact. The out-of-band signals are reflected back with their magnitude intact; however, while the Pi filter maintains the input phase, the T filter provides a phase reversal. This makes the reflected input on 336*a* in-phase with the reflected input on 334*a* (i.e., even mode) which travels through the sum port (354*a*) to signal path 380. In the embodiment of FIG. 3, signal path 380 corresponds to an output of the two-channel multiplexer. In other embodiments in which more stages are used, however, signal path 380 would be coupled to a next channelizer stage.

In one embodiment, the balun 310*a* and balun 310*b* may both be provided as 7-21 GHz baluns (i.e. the baluns operate over the 7-21 GHz frequency range). That is, baluns 310*a*, 310*b* could be the same (i.e. covering the entire frequency range).

Alternatively however, balun 310*b* could be provided as a 7-12 GHz balun. This is possible because balun 310*b* operates over a frequency range defined by the passbands of the filters 390, 392 and since this frequency range is less than the input frequency range, balun 310*b* (as well as subsequent baluns) need only operate over a frequency bandwidth which is less than the frequency bandwidth of balun 310*a*. Since balun 310*b* need only operate over a smaller bandwidth, one could take advantage of this and provide the balun 310*b* having insertion loss, and other characteristics which are improved compared with the like characteristics of the balun 310*a*. This approach allows the operating characteristics of all baluns after the first balun to be improved or in some cases even optimized.

As mentioned above, in this exemplary embodiment, the Pi filter 390 is provided as a low pass filter (LPF) having a stop or cutoff frequency of 13 GHz. This allows the filter to cleanly pass signals in the 7-12 GHz frequency range. Although the filter 390 may be provided having a stop frequency of 13 GHz, other stop frequencies may also be used as long as the stop frequency of the LPF is be selected to cleanly pass signals in the 7-12 GHz frequency range. In one embodiment, the Pi filter 390 is provided as a Butterworth low pass filter and the T filter 392 is a 13 GHz Butterworth low pass filter. The one-stage channelizer 300 receives signals in the 7-21 GHz frequency range (Band 0) on input line 370 (first channel) and signals in the 7-12 GHz frequency range (Band 1) appear on the first output line 382 (first channel) while signals in the 12-21 GHz frequency range (i.e. Band 2) appear on the second output line 380 (second channel). The output signal on line 380 from the circuit in FIG. 3 can be further cascaded with another stage (i.e. another balun-filter pair) to further channelize the band output from the first stage; thus creating a 3-band channelizer. An exemplary embodiment of a three-band channelizer is described below in conjunction with FIG. 4.

Figure 3A:
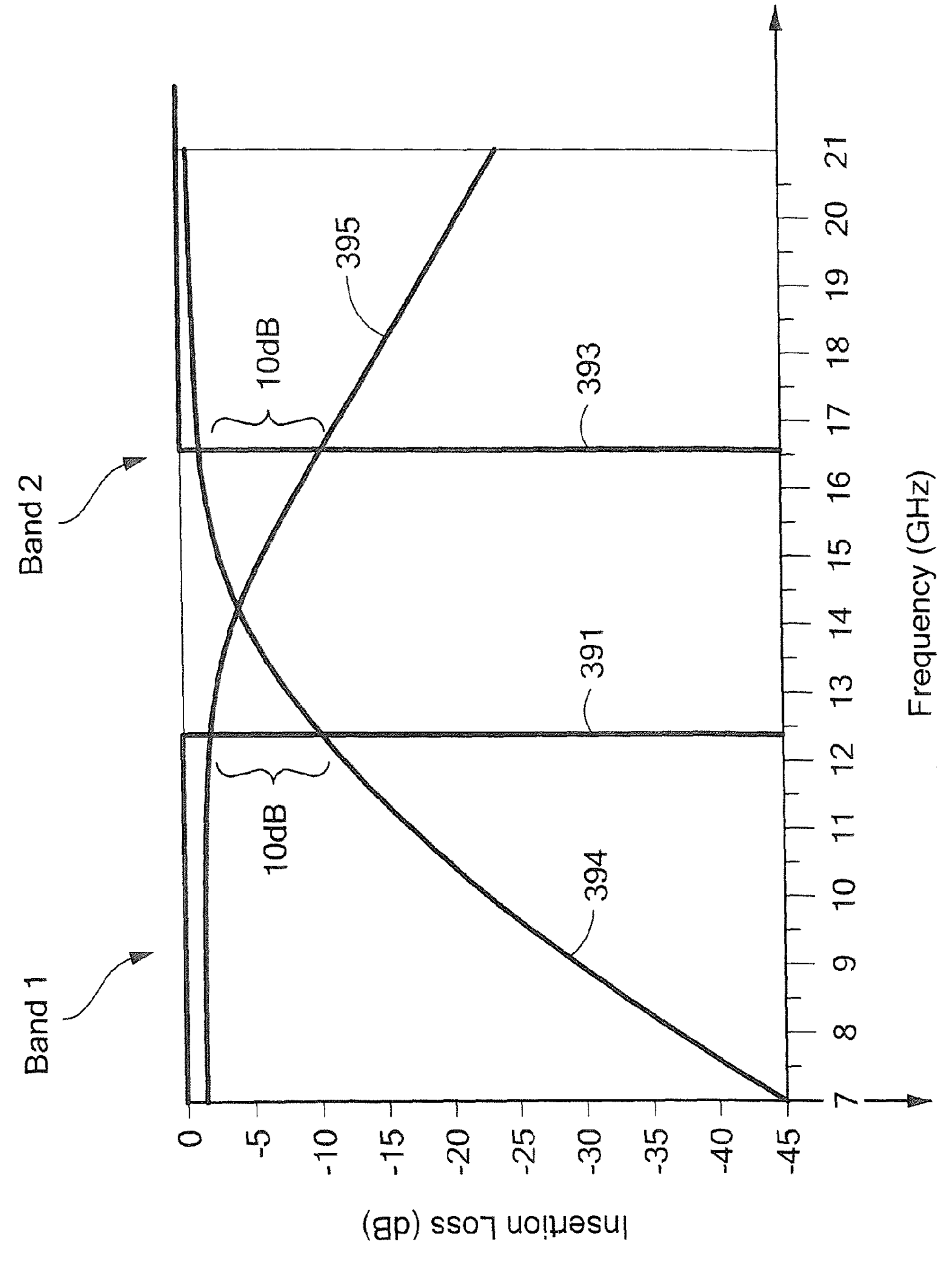
FIG. 3A is a plot of insertion loss versus frequency for an exemplary two-channel multiplexer.

Referring now to FIG. 3A, a plot of insertion loss (dB) versus frequency (GHz) for a one-stage channelizer (also referred to as a two-channel multiplexer) is shown. Curves designated by reference numerals 395 and 394 correspond to measured insertion loss characteristics for Band 1 and Band 2 of a one-stage channelizer comprised of a pair of baluns operational over the 7-21 GHz frequency range. The pair of baluns are appropriately coupled via a pair of Butterworth low pass filters (N=5) with one of the filters being a Pi filter and the other filter being a T-filter.

If one chooses to define a useful channel as a channel having less than 2.2 dB of insertion loss and 10 dB or more of isolation with respect to other channels, then as shown in FIG. 3A, the useful portion of Band 1 is 7 GHz to approximately 12.5 GHz and the useful portion of Band 2 is approximately 16.5 GHz to 21 GHz. Thus, in the example shown in FIG. 3A, the frequency range between approximately 12.5 GHz and 16.5 GHz is not used.

Also shown in FIG. 3A are insertion loss characteristics for an ideal N-plexer (or channelizer) for the useful channel portions (as defined above) of Band 1 and Band 2 (designated by reference numerals 391 and 393, respectively).

Figure 4:
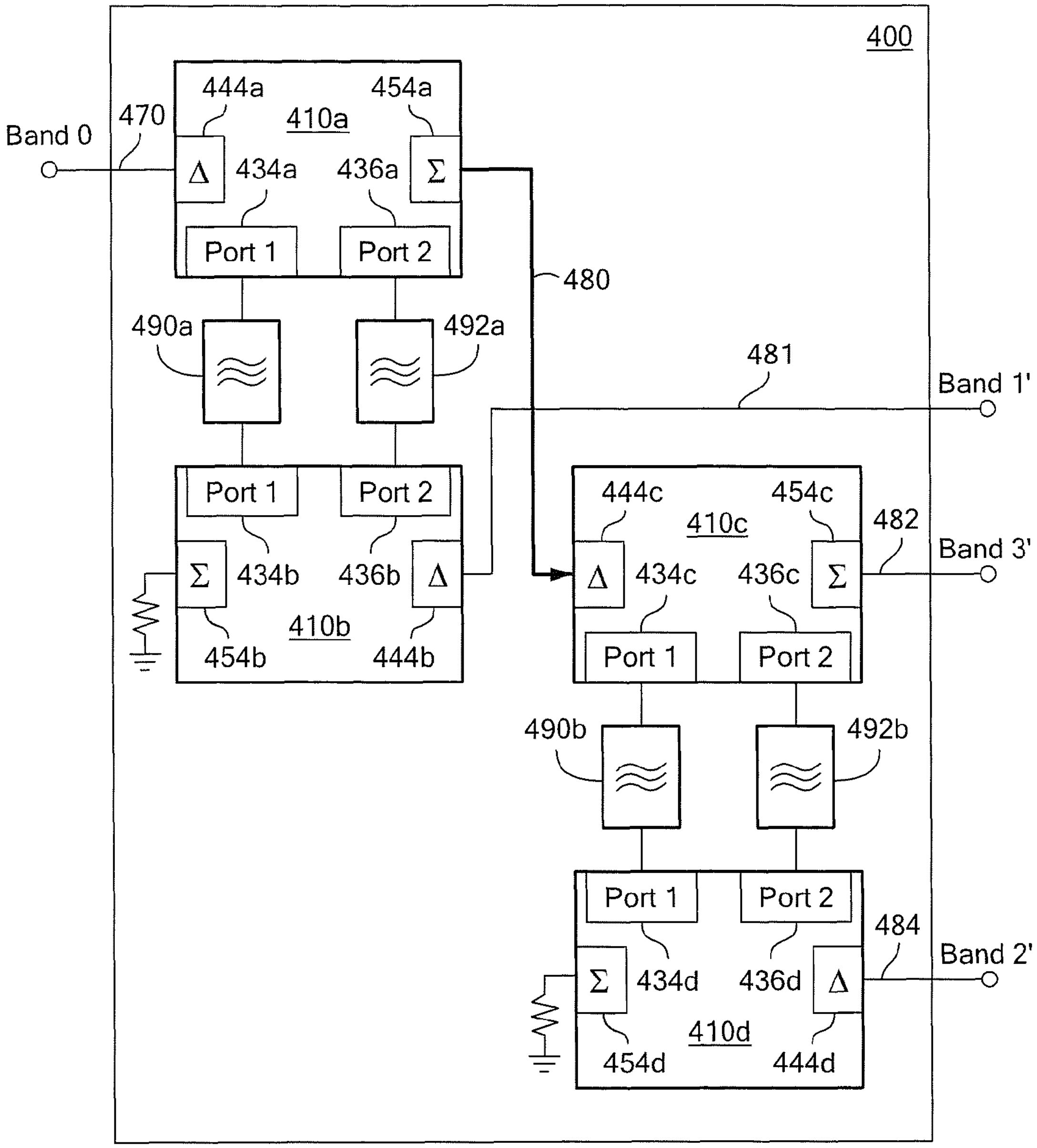
FIG. 4 is a block diagram of a two-stage channelizer (also referred to as a three-channel multiplexer).

Referring to FIG. 4, a two-stage channelizer 400 (also referred to as a three-channel multiplexer 400) includes a balun 410*a* and a balun 410*b* coupled to the balun 410*a* via filters 490*a*, 492*a*. Filters 490*a*, 492 may, for example, be provided as a low pass Pi filter 490*a* and a low pass T filter 492*a*. The two-stage channelizer also includes a balun 410*c* coupled to receive signals from a sum port 454*a* of balun 410*a* and coupled to a balun 410*d* via filters 490*b*, 492*b*. Filters 490*b*, 492*b* may be provided as Pi filter 490*b* and a T filter 492*b*. Each of the filters 490*a*, 492*a*, 490*b*, 492*b* may be provided as low pass filters (LPF) with each of the filters having an appropriately selected and possibly different stop frequency (i.e. the upper frequency limit for the LPF). The filters 490*a*, 492*a*, 490*b*, 492*b*may also be provided having other passband characteristics such as band-pass or high pass filter characteristics. This change in filter characteristics would result in a change in the frequency band (e.g. Band 1, Band 2, etc . . . . ) which appears at the balun ports.

The balun 410*a* includes a difference port 444*a*, a sum port 454*a*, a first port 434*a* and a second port 436*a*. The balun 410*b* includes a difference port 444*b*, a sum port 454*b*, a first port 434*b* and a second port 436*b*. The balun 410*c* includes a difference port 444*c*, a sum port 454*c*, a first port 434*c* and a second port 436*c*. The balun 410*d* includes a difference port 444*d*, a sum port 454*d*, a first port 434*d* and a second port 436*d*.

The sum port 454*a* of balun 410*a* is coupled to the difference port 444*c* of balun 410*c*. The filter 490*a* couples the first port 434*a* of balun 410*a* to the first port 434*b* of balun 410*b*. The filter 490*b* couples the first port 434*c* of balun 410*c* to the first port 434*d* of balun 410*d*. The filter 492*a* couples the second port 436*a* of balun 410*a* to the second port 436*b* of balun 410*b*. The T filter 492*b* couples the second port 436*c* of balun 410*c* to the second port 436*d* of balun 410*d*.

The two-stage channelizer 400 includes an input line 470 coupled to the difference port 444*a* of the balun 410*a*. The two-stage channelizer includes three output lines (or channels): a first output line 481 coupled to the difference port 444*b* of the balun 410*b* (a first channel), a second output line 482 coupled to the sum port 454*c* of the balun 410*c* (a third channel) and a third output line 484 coupled to the difference port 444*d* of the balun 410*d* (a second channel).

In one example of the operation of the two-stage channelizer 400, a signal having a first bandwidth (Band 0) is received at the input line 470 and the two-stage channelizer provides a first output signal having a second bandwidth (Band 1') on line 481, a second output signal having a third bandwidth (Band 2') on line 484 and a third output signal having a fourth bandwidth (Band 3') on line 482 where the frequency bandwidth of Band 0 is equal to the sum of the frequency bandwidths of Band 1', Band 2' and Band 3' (i.e. Band 0=Band 1'+Band 2'+Band 3').

As noted above in conjunction with FIG. 3A, in practical circuits, there may be some portions of the bands (i.e. Band 1', Band 2', Band 3') which will not be used due to the desire to have particular insertion loss or isolation characteristics in a given band.

In one embodiment, the balun 410*a* operates over a 7-21 GHz frequency range, the balun 410*b* operates over a 10-21 GHz frequency range, the balun 410*c* operates over a 10-21 GHz frequency range, the balun 410*d* operates over a 12-21 GHz frequency range, the filters 490*a*, 492*a* are 10 GHz low pass Butterworth filters and the filter 490*b* , 492*b* are 12 GHz low pass Butterworth filters. The two-stage channelizer 400 receives RF signals having frequencies in a 7-21 GHz range at input line 470 and the two-stage channelizer 400 provides RF signals having frequencies in a 7-10 GHz range on output line 481 (the first channel), and RF signals having frequencies in a 12-21 GHz range to output line 482 (second channel) and RF signals having frequencies in a 10-12 GHz range on output line 484 (third channel).

Figure 4A:
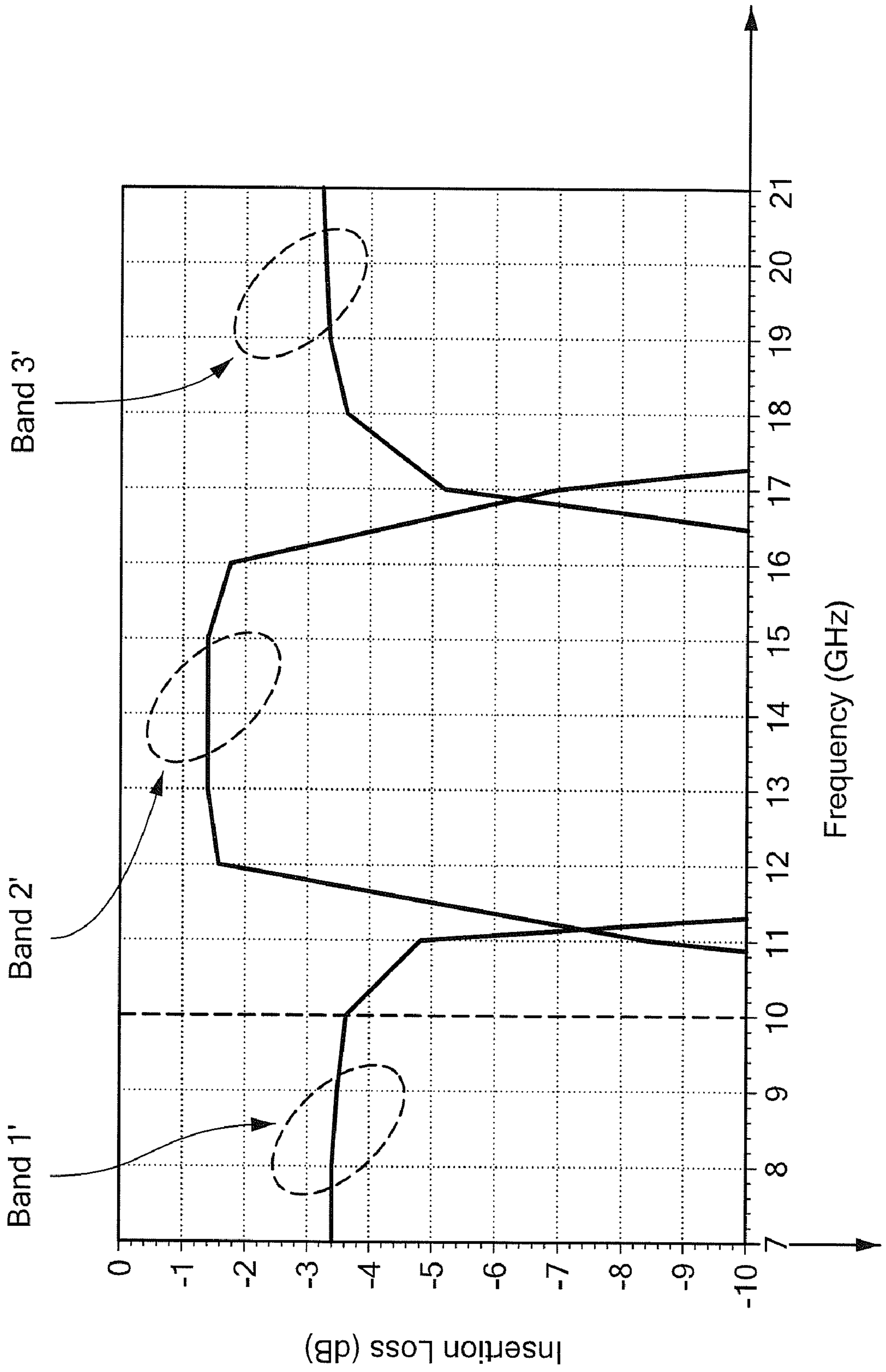
FIG. 4A is a plot of insertion loss versus frequency for an exemplary three-channel multiplexer.

It should be noted that this embodiment utilizes low pass filters and the above bands assume perfect low pass filter characteristics Referring now to FIG. 4A, a plot of insertion loss vs. frequency for an ideal two-stage channelizer is shown. It should be noted that that the channelizer model which produced the results shown used low pass filters in the first stage (18 GHz stop band) and band stop filters in the second stage (14 GHz center frequency and a 5.0 GHz stop bandwidth and a 5.5 GHz pass bandwidth) and that 5-stage (N=5) Butterworth filter designs were used for both the low pass and stop band filters. It should also be appreciated that "ideal" baluns having an insertion loss characteristic of 0.7 dB and filters with an insertion loss characteristic of 0.3 dB were used in channelizer model. Thus, the implementation details of the three-channel multiplexer which produced the insertion loss characteristic shown in FIG. 4A are different than the implementation details of the three-channel multiplexer 400 described above in conjunction with FIG. 4.

If the useful portions of Bands 1' and 3' are defined to be those portions with an insertion loss less than about 3.5 dB, then Band 1 covers the frequency range of 7-10 GHz and Band 3' covers the frequency range of 18-21GHz. Similarly, if the useful portions of Band 2' is defined to be that portion with an insertion loss less than about 2.0 dB, then Band 2' covers the frequency range of 12-16 GHz.

Thus, the useful portion of a channel can be defined by specifying a desired maximum insertion loss within the channel or by specifying a desired isolation between two or more channels or a combination of desired insertion loss and channel isolation may be used. Other characteristics besides insertion loss and isolation may, of course, also be used either individually or in a combination.

It should be noted that the insertion loss for each channel is lower than 4.0 dB and the isolation between channels is greater than 10 dB.

Figure 5:
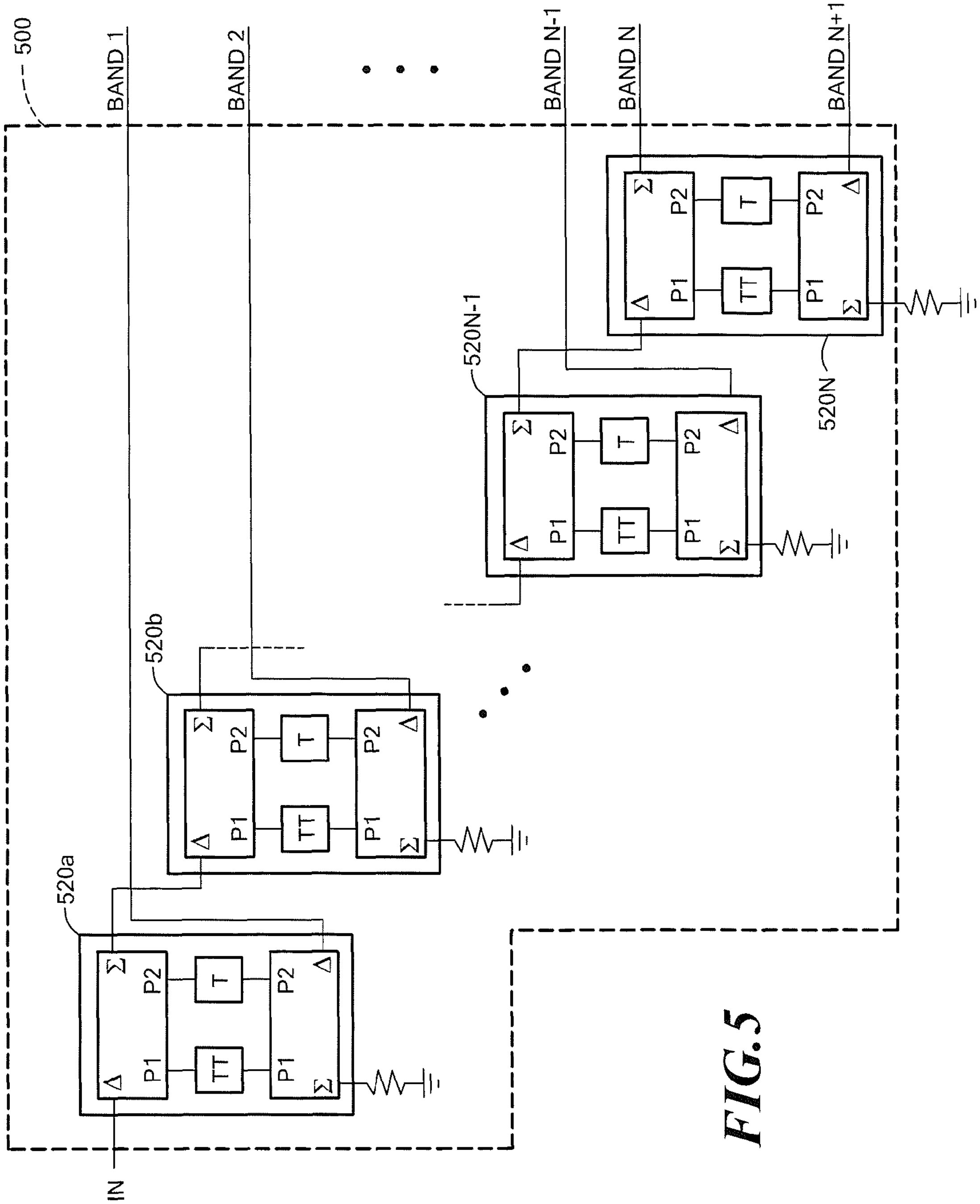
FIG. 5 is a block diagram of a multi-stage channelizer.

Referring to FIG. 5, one of ordinary skill in the art will readily recognize that balun pairs along with filters may be cascaded together to form a channelizer 500 having N stages (which results in a possible N+1 channels). For example, the N-stage channelizer 500 includes a balun-filter pair 520*a*, a balun-filter pair 520*b*, . . . , and a balun-filter pair 520N. In the exemplary embodiment of FIG. 5, the filters are provided having appropriately selected filter characteristics. In one embodiment, the entire N-stage channelizer may be fabricated on a single medium, using microstrip, stripline or other fabrication techniques.

Figure 6:
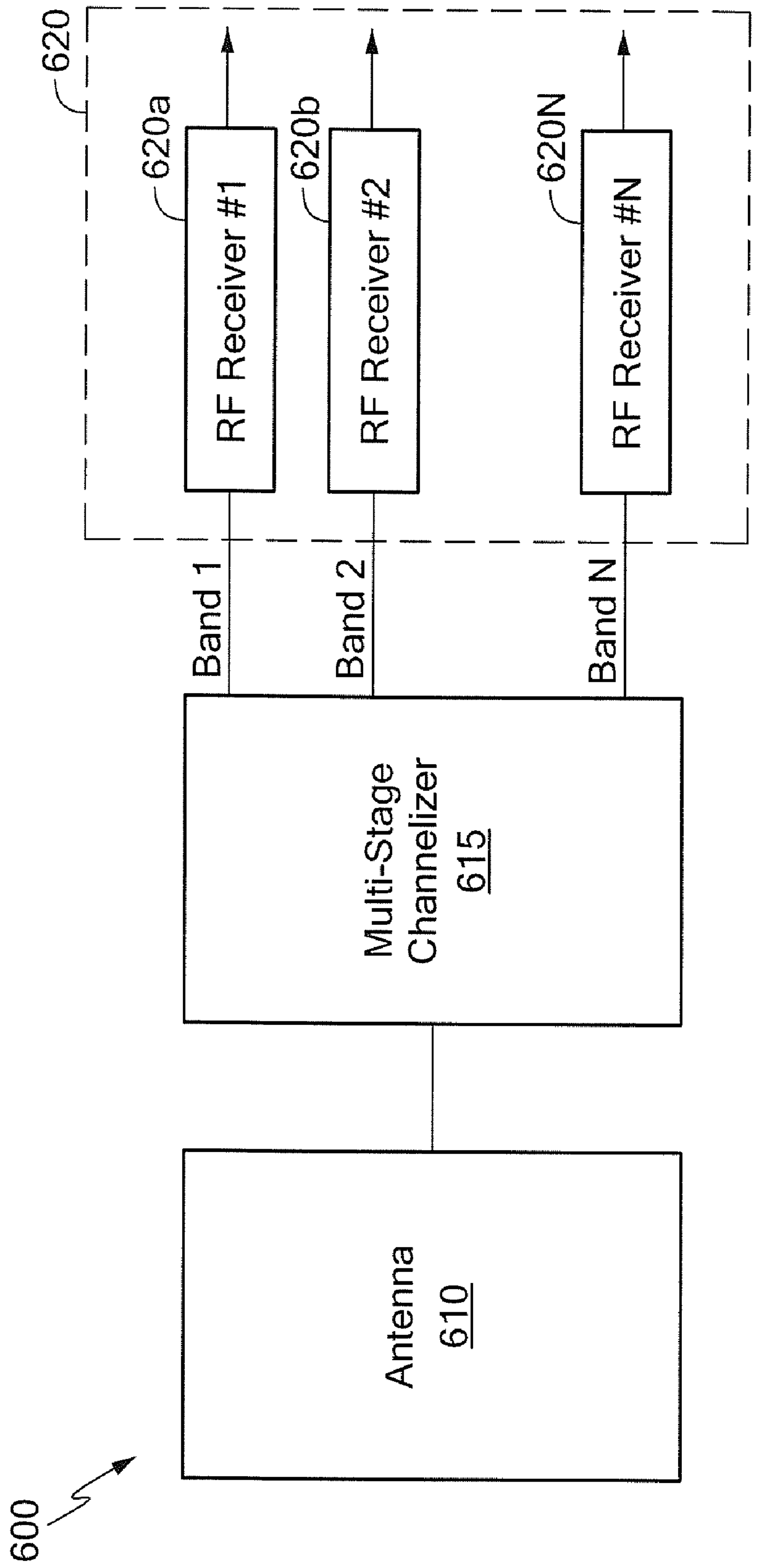
FIG. 6 is an example of an application of a multi-stage channelizer.

Referring to FIG. 6, a multi-function RF system 600 includes an antenna 610 coupled to a multi-stage channelizer 615. The multi-stage channelizer 615 may, for example, be the same as or similar to the N-stage channelizer 500 described above in conjunction with FIG. 5. The multi-stage channelizer 615 provides RF signals to a plurality of receivers 620*a*-620N, generally denoted 620

The RF system 600 may function as a radar system, a communications system and/or an EW system. The N-stage channelizer 615 receives broadband RF signals from wideband antenna 610 and channelizes the received RF signals for receipt by appropriate ones of the plurality of narrowband RF receivers 620*a*-620*n* (e.g., an RF receiver 1 620*a* receives a channel 1, an RF receiver 2 620*b* receives a channel 2, an RF receiver N 620N receives a channel N). Thus, receiver 620*a* may be provided having a frequency bandwidth selected to receive only RF signals in the frequency range of a selected radar system of interest (e.g. an air traffic control system); receiver 620*a* may be provided having a frequency bandwidth selected to receive only RF signals in the frequency range of a communications system; and receiver 620N may be provided having a frequency bandwidth selected to receive only RF signals in the frequency range of an EW system.

The apparatus described herein is not limited to the specific embodiments described herein.

Elements of different embodiments described herein may be combined to form other embodiments not specifically set forth above. Other embodiments not specifically described herein are also within the scope of the following claims.

What is claimed is:

1. A radio frequency (RF) channelizer having an input port and at least two output ports, the channelizer including at least one stage comprising:

a first balun having a first port corresponding to the input port of the RF channelizer, a second port corresponding to a first one of the output ports of the RF channelizer or corresponding to an input to a next stage, a third port and a fourth port;

a second balun having a first port, a second port, a third port and a fourth port;

a first filter coupled between the third port of the first balun and the third port of the second balun; and a second filter coupled between the fourth port of the first balun and the fourth port of the second balun.

2. The channelizer of claim 1 wherein the first filter and the second filter are provided having a pass band for which the first and second filters allow an in-band signal to propagate maintaining input magnitude and phase to the second balun and for which the out-of-band reflection maintains the magnitude and phase of the signal back to the first balun for one of the filters while the other filter reflects a phase reversed signal in the stop band to provide a signal that propagates to a sum port that is the second port of the first balun.

3. The channelizer of claim 1 wherein the first filter is a Pi filter and the second filter is a T filter.

4. The channelizer of claim 1 wherein the first balun and the second balun are fabricated on a single substrate.

5. The channelizer of claim 1 wherein the channelizer is a one-stage channelizer and the first port of the second balun corresponds to a second output of the output ports of the channelizer.

6. The channelizer of claim 1, wherein the second port of the second balun is terminated in an open circuit impedance.

7. The channelizer of claim 1 wherein the first port of the first balun corresponds to a difference port and the second port of the first balun corresponds to a sum port.

8. The channelizer of claim 7 wherein the first port of the second balun corresponds to a difference port and the second port of the second balun corresponds to a sum port.

9. The channelizer of claim 1 wherein the channelizer is a one-stage channelizer and the second port of the second balun is terminated with a desired impedance.

10. The channelizer of claim 9 wherein the second port of the second balun is terminated in an open circuit impedance.

11. The channelizer of claim 1 wherein the first balun comprises:

an input path circuit, the input path circuit comprising the first port of the first balun and the second port of the first balun; and an output path circuit separated from the input path circuit by a layer and disposed on a substrate, the output path circuit comprising the third port of the first balun and the fourth port of the first balun.

12. The channelizer of claim 11 wherein the layer is a polyimide layer and the substrate is an alumina.

13. The channelizer of claim 1 wherein the channelizer is a two-stage channelizer, the second port of the first balun corresponds to an input to the next stage and the first port of the second balun corresponds to a first one of the output ports of the channelizer.

14. The channelizer of claim 1 wherein the channelizer is a two-stage channelizer and the second port of the second balun of each stage is terminated with a desired impedance.

15. The channelizer of claim 1 wherein first portions of the first balun are disposed on a first substrate and second portions of the first balun are disposed on a second different substrate.

16. The channelizer of claim 1 wherein first portions of the second balun are disposed on a first substrate and second portions of the second balun are disposed on a second different substrate.

17. The channelizer of claim 1 wherein first portions of the first and second baluns are disposed on a first substrate and second portions of the first and second baluns are disposed on a second different substrate.

18. A radio frequency (RF) channelizer comprising;

a first substrate having first and second opposing surfaces;

a ground plane disposed over the first surface of said first substrate;

a first plurality of conductors disposed on the second surface of said first substrate, said plurality of conductors arranged to provide portions of a plurality of balun circuits, each of the balun circuits having a loop section;

a second substrate having a first surface disposed over the second surface of said first substrate and having a second surface; and a second plurality of conductors disposed on the second surface of said second substrate such that a portion of said second plurality of conductors overlaps a portion of said first plurality of conductors to provide remaining portions of the plurality of balun circuits, wherein: a first one of the plurality of balun circuits has a first port corresponding to an input port of the RF channelizer having the input port and at least two output ports, a second port corresponding to a first one of the output ports of the RF channelizer, a third port and a fourth port; and a second one of the plurality of balun circuits has a first port, a second port, a third port and a fourth port;

a first filter coupled between the third port of the first balun and the third port of the second balun; and a second filter coupled between the fourth port of the first balun and the fourth port of the second balun.

19. The channelizer of claim 18 wherein:

the first substrate is provided from alumina; and the second substrate is provided from polyimide.

20. The channelizer of claim 18 wherein the first filter and the second filter are provided having a pass band for which the first and second filters allow an in-band signal to propagate maintaining input magnitude and phase to the second balun and for which the out-of-band reflection maintains the magnitude and phase of the signal back to the first balun circuit for one of the filters while the other filter reflects a phase reversed signal in the stop band to provide a signal that propagates to a sum port that is the second port of the first balun circuit.

* * * * *

UNITED STATES PATENT AND TRADEMARK OFFICE

CERTIFICATE OF CORRECTION

PATENT NO. : 7,948,332 B2
APPLICATION NO. : 12/241338
DATED : May 24, 2011
INVENTOR(S) : Keith D. Trott et al.

It is certified that error appears in the above-identified patent and that said Letters Patent is hereby corrected as shown below:

Col. 1 lines 8-9 before the section entitled "RELATED APPLICATIONS," please add the following section entitled "STATEMENT REGARDING FEDERALLY SPONSORED RESEARCH" --This invention was made with Government support under Contract N00014-99-C-0314 awarded by the Department of the Navy. The Government has certain rights in the invention.--

Signed and Sealed this
Twelfth Day of July, 2011

David J. Kappos
*Director of the United States Patent and Trademark Office*